(12) United States Patent
Kim et al.

(10) Patent No.: US 7,361,416 B2
(45) Date of Patent: Apr. 22, 2008

(54) DONOR FILM FOR FLAT PANEL DISPLAY AND METHOD OF FABRICATING OLED USING THE SAME

(75) Inventors: Mu-Hyun Kim, Suwon-si (KR); Byung-Doo Chin, Seongnam-si (KR); Min-Chui Suh, Seongnam-si (KR); Nam-Choul Yang, Seoul (KR); Seong-Taek Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 416 days.

(21) Appl. No.: 10/829,992

(22) Filed: Apr. 23, 2004

(65) Prior Publication Data
US 2005/0048295 A1 Mar. 3, 2005

(30) Foreign Application Priority Data
Aug. 28, 2003 (KR) ............... 10-2003-0060002

(51) Int. Cl.
*B32B 25/20* (2006.01)
(52) U.S. Cl. ............ 428/690; 428/447; 428/913; 428/914; 428/917; 156/272.8; 427/402
(58) Field of Classification Search ........... 428/690, 428/917, 913, 332, 447, 914
See application file for complete search history.

(56) References Cited

U.S. PATENT DOCUMENTS

| 5,220,348 A | 6/1993 | D'Aurelio |
| 5,256,506 A | 10/1993 | Ellis et al. |
| 5,278,023 A | 1/1994 | Bills et al. |
| 5,308,737 A | 5/1994 | Bills et al. |
| 5,725,989 A | 3/1998 | Chang et al. |
| 5,998,085 A | 12/1999 | Isberg et al. |
| 6,114,088 A | 9/2000 | Wolk et al. |
| 6,214,520 B1 | 4/2001 | Wolk et al. |
| 6,699,597 B2 * | 3/2004 | Bellmann et al. .......... 428/690 |
| 7,183,580 B2 * | 2/2007 | Hayashi et al. ............... 257/81 |

FOREIGN PATENT DOCUMENTS

CN 1423596 6/2003

(Continued)

*Primary Examiner*—Terrel Morris
*Assistant Examiner*—Camie S. Thompson
(74) *Attorney, Agent, or Firm*—H.C. Park & Associates, PLC

(57) ABSTRACT

A donor film for a flat panel display and a method of fabricating an Organic Light Emitting Device using the same. The donor film for the flat panel display has a base film, a Light-To-Heat Conversion layer disposed on the base film, a transfer layer disposed on the Light-To-Heat Conversion layer, and a buffer layer interposed between the Light-To-Heat Conversion layer and the transfer layer, wherein the buffer layer includes a material whose glass transition temperature (Tg) is lower than 25° C. The donor film for the flat panel display interposes the buffer layer between the Light-To-Heat Conversion layer of the donor substrate and the transfer layer, thereby improving the adhesion between the transfer layer and the donor substrate. Therefore, the organic layer pattern formed on an acceptor substrate by transferring the transfer layer using the donor film does not include any defect.

13 Claims, 4 Drawing Sheets

FOREIGN PATENT DOCUMENTS

| | | |
|---|---|---|
| JP | 2000118144 | 4/2000 |
| JP | 2003-100454 | 4/2003 |
| KR | 10-1996-0070731 | 12/1996 |
| KR | 10-1996-0076955 | 12/1996 |
| KR | 10-2000-0034508 | 6/2000 |
| KR | 1020000034508 | 6/2000 |
| WO | 01-47720 | 7/2001 |
| WO | 01-83233 | 11/2001 |
| WO | 02-070271 | 9/2002 |

\* cited by examiner

DONOR FILM FOR FLAT PANEL DISPLAY AND METHOD OF FABRICATING OLED USING THE SAME

CROSS-REFERENCE TO RELATED APPLICATION

This application claims the benefit of Korean Patent Application No. 2003-60002, filed on Aug. 28, 2003, the disclosure of which is hereby incorporated herein by reference in its entirety.

BACKGROUND OF THE INVENTION

1. Field of the Invention

The present invention relates to a donor film for a flat panel display and a method of fabricating an Organic Light Emitting Device (OLED) using the same and, more particularly, to a donor film for a flat panel display with improved adhesion with a transfer layer and a method of fabricating an OLED using the same.

2. Description of the Related Art

In general, an Organic Light Emitting Device (hereinafter referred to as "OLED") as a flat panel display includes anodes, cathodes and organic layers interposed between the anodes and cathodes. The organic layers must include an emission layer and may further include a hole injecting layer, a hole transporting layer, an electron transporting layer and an electron injecting layer therewith. The OLED may be classified into a polymer OLED and a small molecular OLED based on a material composing the organic layer, more specifically the emission layer of the organic layer.

In implementing full color for the OLED, the emission layer must be patterned. There are methods for patterning the emission layer of the OLED. The small molecular OLED is patterned using a shadow mask and the polymer OLED is patterned by ink-jet printing or Laser Induced Thermal Imaging (hereinafter referred to as "LITI"). The LITI method has advantages of finely patterning the organic layer in a dry process. On the other hand, the ink-jet printing method patterns the organic layer in a wet process.

The method for patterning the polymer organic layer using the LITI needs at least a light source, an OLED substrate (i.e., an acceptor substrate) and a donor film. Here, the donor film includes a base film, a Light-To-Heat Conversion layer (hereinafter referred to as "LTHC") and a transfer layer comprising an organic layer. The organic layer on the acceptor substrate is patterned as follows: when the light source irradiates light to the LTHC layer of the donor film, the LTHC layer absorbs the incident light and then converts the light into heat energy. Then the heat energy transfers the organic layer of the transfer layer onto the acceptor substrate. This process is disclosed in Korean Patent Application No. 10-1998-0051844, U.S. Pat. Nos. 5,998,085, 6,214,520 and 6,114,088, which are hereby incorporated by reference.

FIGS. 1A and 1B are cross-sectional views for explaining a transfer mechanism in a transfer process of a typical organic layer by the LITI method.

Referring to FIG. 1A, an organic layer $S_2$ is attached to a donor substrate $S_1$, which is composed of a base film $S_{1a}$ and an LTHC layer $S_{1b}$, with first adhesion $W_{12}$ between the donor substrate $S_1$ and the organic layer $S_2$. An acceptor substrate $S_3$ is disposed under the donor substrate $S_1$.

Referring to FIG. 1B, laser light is irradiated onto a first area $R_1$ of the base film $S_{1a}$ except for a second area $R_2$. The laser light passed through the base film $S_{1a}$ is converted into heat energy in the LTHC layer and then the heat induces a change in the first adhesion $W_{12}$ of the first area $R_1$ such that the organic layer $S_2$ is transferred onto the acceptor substrate $S_3$. In the transfer process, the transfer characteristic of the organic layer $S_2$ depends on the first adhesion $W_{12}$ between the donor substrate $S_1$ of the second area $R_2$ and the organic layer $S_2$, cohesion $W_{22}$ within the organic layer $S_2$, and second adhesion $W_{23}$ between the organic layer $S_2$ and the acceptor substrate $S_3$.

However, if the first adhesion $W_{12}$ is relatively smaller, the organic layer $S_2$ may be easily detached from the donor substrate S1. As a result, the organic layer $S_2$ of the second region $R_2$ without the laser irradiation is transferred even though it is not intended. This problem appears more seriously in the organic layer $S_2$ including small molecular materials.

SUMMARY OF THE INVENTION

The present invention provides a donor film for a flat panel display improving an adhesion characteristic with a transfer layer.

The present invention separately provides a method for fabricating an OLED using the donor film for a flat panel display.

In the present invention, the donor film includes a base film, an LTHC layer on the base film, a transfer layer on the LTHC layer, and a buffer layer interposed between the LTHC layer and the transfer layer, wherein the buffer layer includes a material whose glass transition temperature (Tg) is lower than 25° C.

The material with the lower glass transition temperature than 25° C. may be a silicone polymer. In such a case, the buffer layer is formed by forming a liquid silicone polymer on the LTHC layer and then curing it by any of UV curing, room temperature curing, low temperature curing and catalytic curing. The buffer layer is preferably less than 20 μm thick. More preferably, the buffer layer is less than 5 μm thick.

The transfer layer includes at least one layer of an emitting organic layer, a hole injecting organic layer, a hole transporting organic layer, an electron transporting organic layer and an electron injecting organic layer. More preferably, the transfer layer is an emitting organic layer. Preferably, each of the organic layers includes a small molecular material. Preferably, the donor film further comprises an interlayer interposed between the LTHC layer and the buffer layer.

The present invention also discloses a method for fabricating an OLED using the donor film.

BRIEF DESCRIPTION OF THE DRAWINGS

The above and other features and advantages of the present invention will become more apparent to those of ordinary skill in the art by describing in detail exemplary embodiments thereof with reference to the attached drawings.

DETAILED DESCRIPTION OF THE INVENTION

Figure 1A:
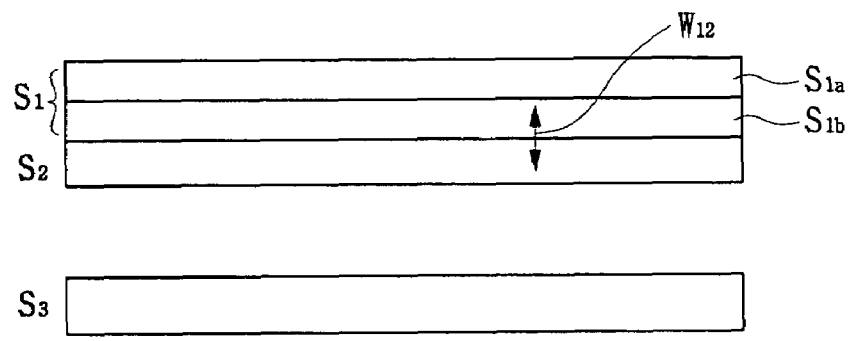
FIGS. 1A and 1B are cross-sectional views for explaining a transfer mechanism in a transfer process of a typical organic layer by LITI.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
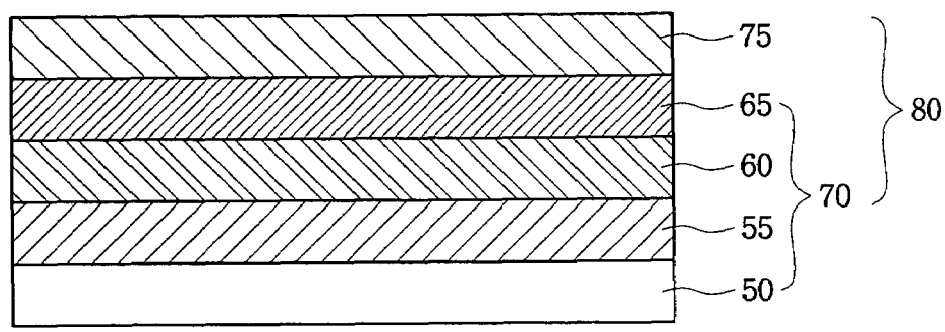
FIG. 2 is a cross-sectional view of a donor film for a flat panel display according to the present invention.

FIG. 2 is a cross-sectional view of a donor film for a flat panel display. Referring to FIG. 2, a base film 50 is provided and an LTHC layer 55 is formed on the base film 50.

Here, the base film 50 is composed of polymers that are transparent. Polyacryl, polyepoxy, polyethylene, polystyrene and polyester such as polyethylene terephthalate are used for the base film. Of the polymers, a polyethylene terephthalate film is mainly used for the base film 50. The base film 50 acts as a supporting material. Thus, it should have suitable optical properties and sufficient mechanical stability. Preferably, the thickness of the base film 50 ranges from 10 to 500 μm.

The LTHC layer 55 absorbs light in the infrared-visible region of the electromagnetic spectrum and converts a portion of the light into heat. The LTHC layer 55 has an appropriate optical density and includes light absorbing materials. The LTHC layer 55 can include a metal layer or an organic polymer layer. The metal layer can include aluminum oxide or aluminum sulfate as the light absorbing material. The organic polymer layer can include carbon black, graphite or infrared dyes as the light absorbing material. Here, the metal layer is formed by vacuum evaporation, electron beam deposition or sputtering. In the exemplary embodiment, the metal layer is about 100 to 5,000 Å thick. Also, the organic layer is formed by one of typical layer coating methods such as roll, gravure, extrusion, spin and knife coating methods. In the exemplary embodiment, the organic polymer layer is about 0.1 to 10 μm thick.

Then, an interlayer 60 may be formed on the LTHC layer 55. The interlayer 60 prevents the transfer layer that will be formed in the following process from contaminated by the light absorbing material, such as carbon black included in the LTHC layer 55. The interlayer 60 may be formed of acrylic resin or alkyd resin. The interlayer 60 is formed through a well-known coating process such as solvent coating, etc. and a curing process such as an ultraviolet curing process. Preferably, the interlayer 60 is formed in the range of 1 to 2 μm thick.

Then, a buffer layer 65 is formed on the LTHC layer 55 or on the interlayer 60. Namely, a donor substrate 70 can be a portion including the LTHC layer 55 and the buffer layer 65 stacked in such order on the base film 50, or can be a portion including the LTHC layer 55, the interlayer 60 and the buffer layer 65 stacked in such order on the base film 50.

Subsequently, a transfer layer 75 is formed on the donor substrate 70, that is, the buffer layer 65. This completes a donor film 80.

Figure 1B:
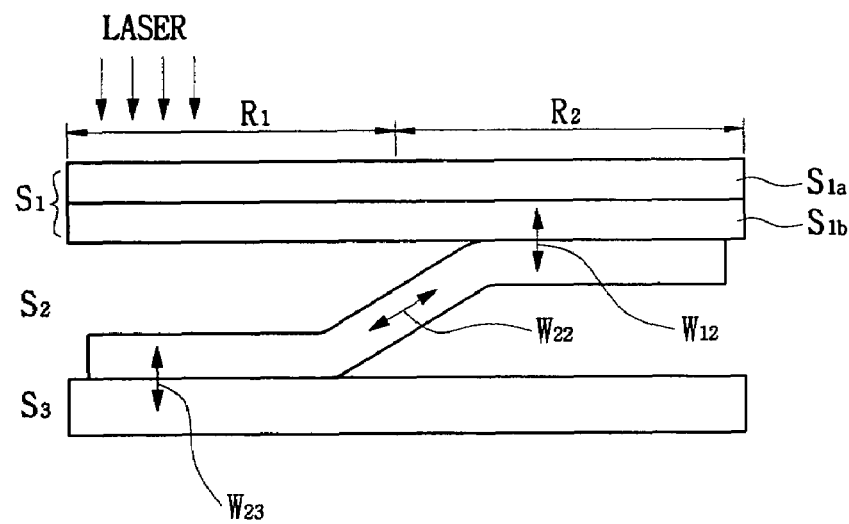

The buffer layer 65 improves adhesion between the donor substrate 70 and the transfer layer 75, that is, the first adhesion $W_{12}$ of FIG. 1. Namely, referring to FIG. 1, the improved adhesion prevents the transfer layer 75 from being easily detached from the donor substrate 70 during the transfer process. This reduces pattern defects of undesired transfer of portion onto the acceptor substrate. Consequently, in the present invention, the introduction of the buffer layer 65 can improve the transfer characteristic of the transfer layer 75. Also, the buffer layer 65 buffers acceptor substrate during the transfer process, thereby minimizing patterning defects.

Preferably, the buffer layer 65 includes a material whose glass transition temperature (Tg) is lower than 25° C. Generally, under the glass transition temperature (Tg), a polymer material is in a glass state since micro Brown motion of molecules is frozen. But, over the glass transition temperature (Tg), a polymer material has high adhesive strength since its flexibility or elasticity is higher. Therefore, typically, in the transfer process of the LITI performed over 25° C., the buffer layer 65 having the material whose glass transition temperature is lower than 25° C. can improve adhesion between the donor substrate 70 and the transfer layer 75, that is, the first adhesion $W_{12}$ of FIG. 1.

More preferably, the buffer layer 65 is formed using a silicone polymer. The silicone polymer has a Siloxane (Si—O) bond therein, high heat resistance and chemical stability, and the glass transition temperature lower than 25° C. The buffer layer 65 using the silicone polymer is formed by coating a liquid silicone polymer on the LTHC layer 55 or the interlayer 60 and then curing it. Here, the curing process is done by ultraviolet curing, room temperature curing, low temperature curing, or catalyzer curing.

Preferably, the buffer layer 65 is formed by one of spin coating, roll coating, dip-coating, gravure coating, deposition, etc. Preferably, the buffer layer 65 is less than 20 μm thick. More preferably, it is less than 5 μm thick. Preferably, the buffer layer 65 is formed to be less than 20 μm thick, if a portion to be transferred is even in the acceptor substrate to which the transfer layer 75 is transferred from the donor substrate 70. But if the portion to be transferred is not even but recessed, even edges of the recessed portion to be transferred must adhere closely to the donor film to prevent patterning defects. Therefore, preferably, the buffer layer 65 must be less than 5 μm thick.

The transfer layer 75 can be at least one of the layers among an emitting organic layer, a hole injecting organic layer, a hole transporting organic layer, an electron transporting organic layer and an electron injecting organic layer. Preferably, each of the organic layers is an organic layer including a small molecular material. The small molecular material may be a monomolecular material or an oligomer. Preferably, the oligomer has a molecular weight lower than 1000. Because, in general, the organic layer including a small molecular material shows poor adhesion property ($W_{12}$ of FIG. 1), introduction of the buffer layer 65 can largely improve the transfer characteristics. Meanwhile, there are some small molecular materials with relatively low thermal stability. If the transfer layer 75 includes the small molecular material with relatively low thermal stability, the heat generated in the LTHC layer 55 may damage them. But the buffer layer 65 can control the heat and thereby protect the transfer layer 75 from heat damage.

General materials used for the organic layer can be adopted to fabricate the emitting organic layer, the hole injection organic layer, the hole transporting organic layer, the electron transporting organic layer and the electron injecting organic layer. Preferably, the emitting organic layer is fabricated with a small molecular material such as Alq3 (host)/DCJTB (fluorescent dopant), Alq3(host)/DCM(fluorescent dopant) and CBP(host)/PtOEP (phosphorescent organic-metal complex), or a polymer such as a PFO-based polymer and a PPV-based polymer as a red light emitting material. Also, it is fabricated with a small molecular material such as Alq3, Alq3 (host)/C545t (dopant) and CBP (host)/IrPPy (phosphorescent organic-metal complex), or a polymer such as the PFO-based polymer and the PPV-based polymer as a green light emitting material. Further it is fabricated with a small molecular material such as DPVBi, spiro-DPVBi, spiro-6P, distyrylbenzene (DSB) and distyrylarylene (DSA), or a polymer such as the PFO-based polymer and the PPV-based polymer as a blue light emitting material. The hole injecting organic layer can use a small molecular material such as CuPc, TNATA, TCTA and TDAPB, or a polymer such as PANI and PEDOT. The hole transporting organic layer can use a small molecular material such as an arylamine-based small molecular material, a hydrazone-based small molecular material, a stilbene-based small molecular material and a starburst-based small molecular material, for example, NPB, TPD, s-TAD, MTA-DATA, etc., or a polymer such as a carbazole-based polymer, an arylamine-based polymer, a perylene-based polymer and a pyrrol-based polymer, for example, PVK, etc. The electron transporting organic layer can be fabricated with a polymer such as PBD, TAZ and spiro-PBD, or a small molecular material such as Alq3, BAlq and SAlq. Also, the electron injecting organic layer is fabricated with a small molecular material such as Alq3, Ga complex and PBD, or a polymer such as an oxadiazole-based polymer.

The transfer layer 75 is formed by a general coating process such as extrusion coating, spin coating, knife coating, vacuum deposition, CVD, etc., to a thickness ranging from 100 to 50,000 Å.

Figure 3:
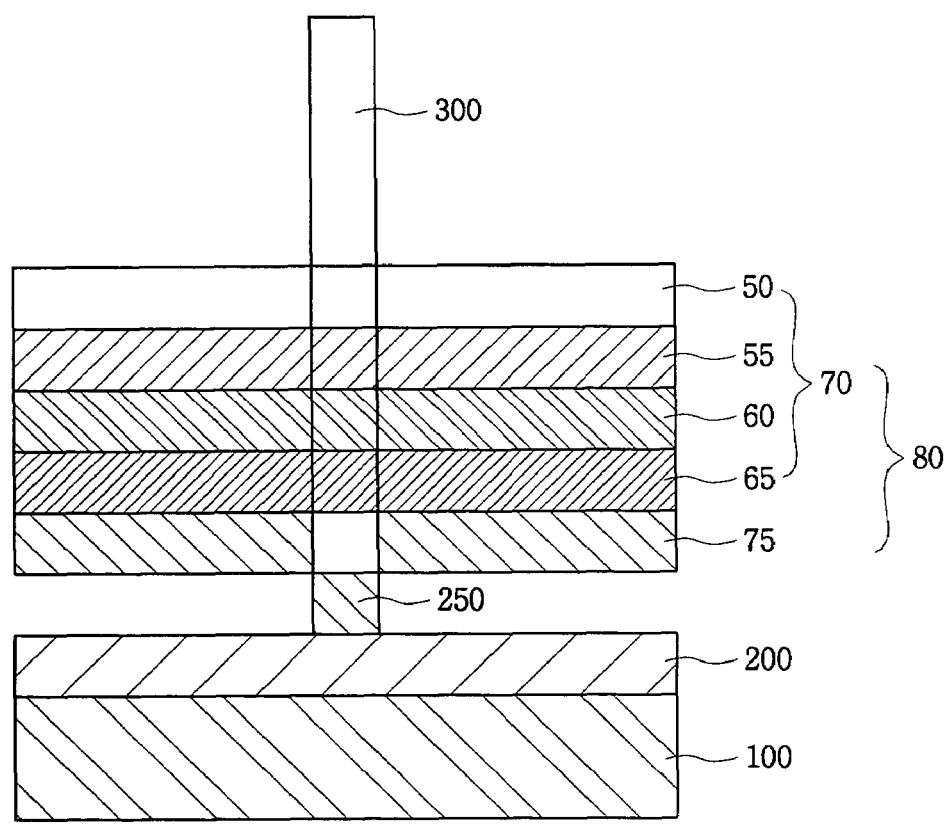
FIG. 3 is a cross-sectional view for showing a step for fabricating an OLED using a donor film for a flat panel display according to the present invention.

FIG. 3 is a cross-sectional view for explaining a method of fabricating an OLED using the donor film according to the present invention.

Referring to FIG. 3, an acceptor substrate 100 has a pixel electrode 200 formed thereon. Meanwhile, the donor film 80 is fabricated by depositing the LTHC layer 55, the buffer layer 65 and the transfer layer 75 on the base film 50 in order. The interlayer 60 may be further deposited on the LTHC layer 55 before forming the buffer layer 65. The donor film 80 is fabricated as described above.

Then, the donor film 80 is disposed with a predetermined distance from the acceptor substrate 100 so that the transfer layer 75 of the donor film 80 faces the acceptor substrate 100, and laser light 300 is irradiated on a predetermined region of the donor film 80. Then the transfer layer 75 irradiated by the laser light 300 is transferred onto the pixel electrode 200, thereby forming an organic layer pattern 250 on the pixel electrode 200.

The organic layer pattern 250 may include at least one layer selected from a group of an emission organic layer, a hole injecting organic layer, a hole transporting organic layer, an electron transporting organic layer and an electron injection organic layer. Preferably, each of the organic layers includes a small molecular material.

The pixel electrode 200 may be an anode. The hole injection organic layer and/or hole transporting organic layer are formed on the pixel electrode 200 by LITI process, spin coating or vacuum deposition. And then the organic layer pattern 250, i.e., an emission layer, is formed on the hole transporting organic layer by using the donor film 80. After forming the emission layer, the electron transporting organic layer and/or electron injection organic layer can be formed on the emission layer using the LITI process, vacuum deposition or spin coating. Subsequently, a common electrode (not shown) as a cathode is formed on the electron transporting layer, thereby fabricating the OLED.

Hereinafter, preferred examples are given to better understand the present invention. However, the following examples do not limit the scope of the invention.

EXPERIMENTAL EXAMPLE 1

A base film composed of polyethylene terephthalate with a thickness of 100 μm is prepared. An LTHC layer including carbon black as a light absorbing material is formed with a thickness of 4 μm on the base film. After that, an acrylic resin as an interlayer is formed with a thickness of 1 μm on the LTHC layer. A liquid silicone polymer, 2577 (Dow Corning Corporation), is coated with a thickness of 1 μm on the interlayer by spin coating. The coated 2577 (Dow Corning Corporation) is dried at 25° C. for 10 minutes, heat treated at 80° C. for 10 minutes, and left at 25° C. for more than 6 hours, thereby forming the buffer layer. Here, the liquid silicone polymer 2577 (Dow Corning Corporation) is a polymer cured at 25° C. by reacting with moisture. Further its curing time is more shortened if it is heat treated at 80° C. CBP (Sigma Aldrich) including IrPPy (Sigma Alrich) of 7 wt. % is deposited on the entire surface of the buffer layer by using vacuum deposition to form a transfer layer, thereby fabricating a donor film. Here, the IrPPy-doped CBP is a green light emitting material as one of the electroluminescent small molecular materials.

EXPERIMENTAL EXAMPLE 2

A liquid silicone polymer UVHC3000 (General Electric Corporation) is coated with a thickness of 1 μm on an interlayer by spin coating. The coated UVHC3000 (General Electric Corporation) is dried at 25° C. for 10 minutes, heat treated at 80° C. for 10 minutes and cured by using a UV lamp (maximum wavelength of 254 nm) for 15 minutes, thereby forming the buffer layer. Except for the step of forming the buffer layer, other processes for fabricating the donor film are the same as the Experimental Example 1.

COMPARISON EXAMPLE 1

A UV-cured sealant 68 (Norland Corporation) with a glass transition temperature of higher than 25° C. (about 100° C.) is coated with a thickness of 5 μm on the interlayer. The coated UV-cured sealant 68 is heat treated at 80° C. for 10 minutes and cured by using a UV lamp (maximum wavelength of 254 nm) for 15 minutes, thereby forming the buffer layer. Except for the step of forming the buffer layer, other processes for fabricating the donor film are the same as the Experimental Example 1.

COMPARISON EXAMPLE 2

A base film composed of polyethylene terephthalate with a thickness of 100 μm is prepared. An LTHC layer including carbon black as a light absorbing material is formed with a thickness of 4 μm on the base film. After that, an acrylic resin as an interlayer is formed with a thickness of 1 μm on the LTHC layer. CBP (Sigma Aldrich) including IrPPy (Sigma Alrich) of 7 wt. % is deposited on the entire surface of the interlayer by using vacuum deposition to form a transfer layer, thereby fabricating a donor film.

Meanwhile, acceptor substrates on which pixel electrodes are formed are respectively prepared. After that, each of the donor films fabricated through the experimental examples 1 and 2 and the comparison examples 1 and 2 is disposed on the each of the acceptor substrates. Then the transfer layer is transferred onto the acceptor substrate by the LITI process, thereby forming the emission layer pattern on each of the acceptor substrates.

Figure 4A:
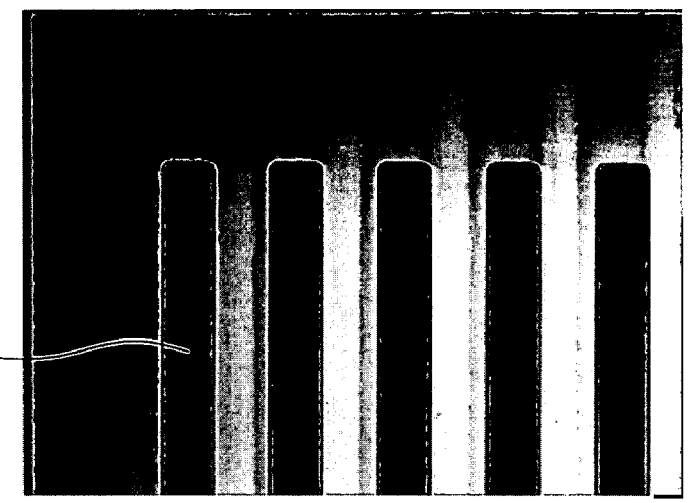
FIGS. 4A and 4B are views showing emission layer patterns formed on an acceptor substrate using a donor film that are fabricated through experimental examples 1 and 2, respectively.
Figure 4B:
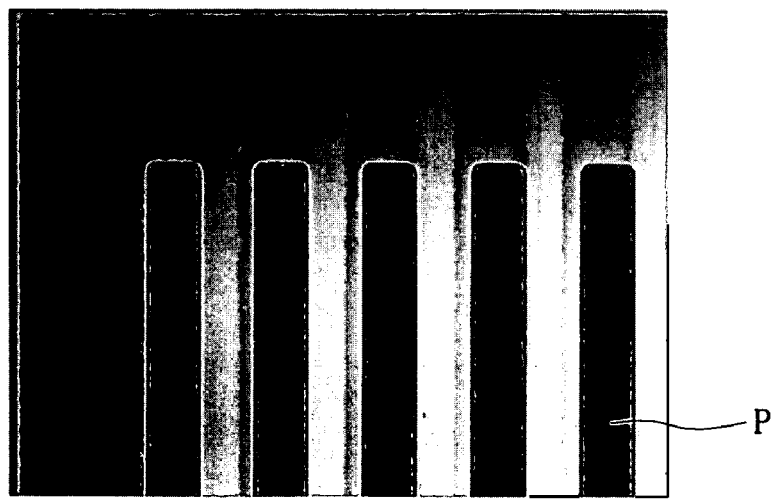
Figure 5A:
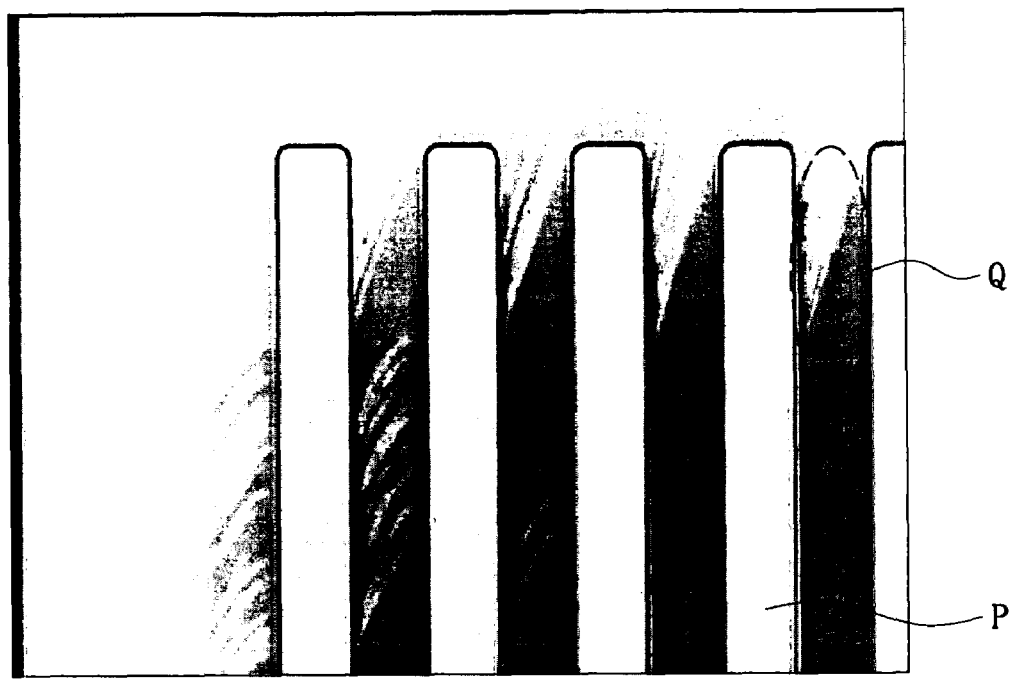
FIGS. 5A and 5B are views showing emission layer patterns formed on an acceptor substrate using a donor film that are fabricated through comparison examples 1 and 2, respectively.
Figure 5B:
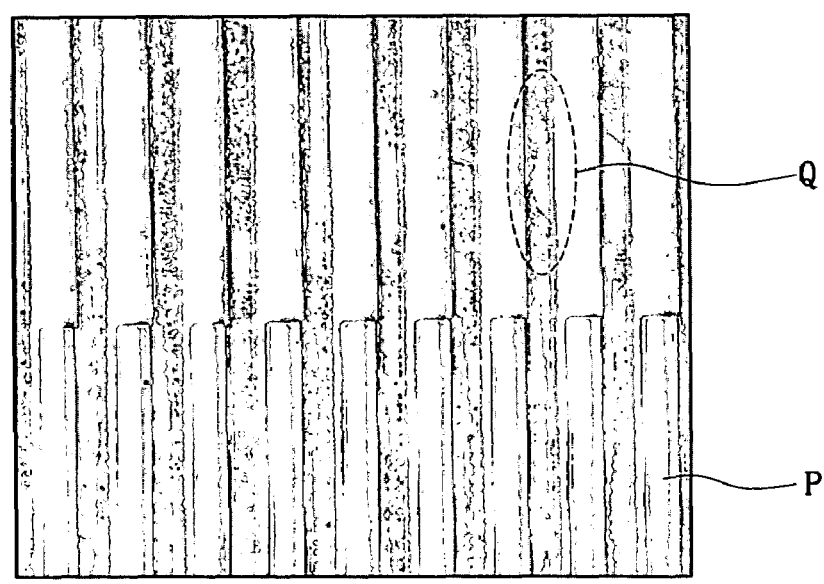

FIGS. 4A and 4B are views showing an emission layer patterns formed on the acceptor substrate using the donor film which is fabricated through the experimental examples 1 and 2, respectively. FIGS. 5A and 5B are views showing the emission layer patterns formed on the acceptor substrate using the donor film which is fabricated through the comparison example 1 and 2, respectively.

Referring to FIGS. 5A and 5B, there are an emission layer pattern P and a defect pattern Q having a portion which should not be transferred from the transfer layer on the substrate. However, FIGS. 4A and 4B show an emission layer pattern P, but no defect pattern, which can result from employing the buffer layer within the donor film to improve the adhesion between the transfer layer and the donor substrate.

As disclosed above, the donor film for a flat panel display according to the present invention interposes the buffer layer between the LTHC layer of the donor substrate and the transfer layer, thereby improving the adhesion between the transfer layer and the donor substrate. Therefore, the organic layer pattern formed on the substrate by transferring the transfer layer using the donor film according to the present invention does not include any defect.

This invention may be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

What is claimed is:

1. A donor film for a flat panel display, comprising:
    a base film;
    a Light-To-Heat Conversion layer disposed on the base film;
    a transfer layer disposed on the Light-To-Heat Conversion layer; and
    a buffer layer interposed between the Light-To-Heat Conversion layer and the transfer layer,
    wherein the buffer layer includes a silicone polymer whose glass transition temperature (Tg) is lower than 25° C.

2. The donor film according to claim 1, wherein the buffer layer is formed as a liquid silicone polymer is formed on the Light-To-Heat Conversion layer and then the formed liquid silicone polymer is cured by one process selected from a group of UV curing, room temperature curing, low temperature curing and catalytic curing.

3. The donor film according to claim 1, wherein the buffer layer is less than 20 μm thick.

4. The donor film according to claim 3, wherein the buffer layer is less than 5 μm thick.

5. The donor film according to claim 1, the transfer layer includes at least one layer selected from a group of an emitting organic layer, a hole injecting organic layer, a hole transporting organic layer, an electron transporting organic layer and an electron injecting organic layer.

6. The donor film according to claim 5, the transfer layer is an emitting organic layer.

7. The donor film according to claim 5, wherein each of the organic layers includes a small molecular material.

8. The donor film according to claim 1, further comprising an interlayer interposed between the Light-To-Heat Conversion layer and the buffer layer.

9. A method for fabricating an Organic Light Emitting Device, comprising:
    forming an acceptor substrate with a pixel electrode;
    arranging a donor film over the acceptor substrate, wherein the donor film includes a Light-To-Heat Conversion layer, a buffer layer and a transfer layer on a base film; and
    irradiating a predetermined area of the base film with a laser beam to transfer,
    wherein the buffer layer includes a silicone polymer whose glass transition temperature ($T_g$) is lower than 25° C.

10. The method according to claim 9, wherein the transfer layer includes at least one layer selected from a group of an emitting organic layer, a hole injecting organic layer, a hole transporting organic layer, an electron transporting organic layer and an electron injecting organic layer.

11. A method for fabricating a donor film, comprising;
    forming a light-to-heat-conversion (LTHC) layer on a base film;
    forming a buffer layer on the LTHC layer; and
    forming a transfer layer on the LTHC layer,
    wherein the buffer layer includes a silicone polymer whose glass transition temperature ($T_g$) is lower than 25° C.

12. The method according to claim 11, wherein the LTHC layer includes a metal layer or an organic polymer layer, and
    wherein the metal layer is formed by vacuum evaporation, electron beam deposition or sputtering and the organic layer is formed by a roll coating method, a gravure coating method, an extrusion coating method, a spin coating method, and a knife coating method.

13. The method according to claim 11, further comprising:
    forming an interlayer between the LTHC and the buffer layer.

* * * * *